(12) United States Patent
Tokunaga et al.

(10) Patent No.: US 10,698,540 B2
(45) Date of Patent: Jun. 30, 2020

(54) METHODS AND APPARATUS FOR A CAPACITIVE TOUCH SENSOR

(71) Applicant: SEMICONDUCTOR COMPONENTS INDUSTRIES, LLC, Phoenix, AZ (US)

(72) Inventors: Tetsuya Tokunaga, Oura-gun (JP); Takayasu Otagaki, Ota (JP); Kensuke Goto, Ashikaga (JP)

(73) Assignee: SEMICONDUTOR COMPONENTS INDUSTRIES, LLC, Phoenix, AZ (US)

( * ) Notice: Subject to any disclaimer, the term of this patent is extended or adjusted under 35 U.S.C. 154(b) by 61 days.

(21) Appl. No.: 15/876,417

(22) Filed: Jan. 22, 2018

(65) Prior Publication Data

US 2019/0227648 A1 Jul. 25, 2019

(51) Int. Cl.
| | | |
|---|---|---|
| G06F 3/044 | (2006.01) | |
| H03K 17/96 | (2006.01) | |
| G06F 3/01 | (2006.01) | |
| G06F 3/041 | (2006.01) | |

(52) U.S. Cl.
CPC ............. *G06F 3/044* (2013.01); *G06F 3/016* (2013.01); *G06F 3/0418* (2013.01); *H03K 17/962* (2013.01); *G06F 2203/04112* (2013.01); *H03K 2217/960745* (2013.01); *H03K 2217/960775* (2013.01)

(58) Field of Classification Search
CPC ........ G06F 3/044; G06F 3/016; G06F 3/0418; G06F 2203/04112; H03K 17/962; H03K 2217/960745; H03K 2217/960775
See application file for complete search history.

(56) References Cited

U.S. PATENT DOCUMENTS

| 9,151,792 | B1* | 10/2015 | Kremin | ............. G01R 27/2605 |
| 2011/0115717 | A1* | 5/2011 | Hable | ................... G06F 3/0416 345/173 |
| 2012/0050214 | A1 | 3/2012 | Kremin | |
| 2012/0200388 | A1 | 8/2012 | Miura | |
| 2014/0049505 | A1* | 2/2014 | Radivojevic | ........ G06F 3/04883 345/174 |
| 2016/0378252 | A1* | 12/2016 | Jeong | ...................... G06F 3/044 345/174 |
| 2017/0030119 | A1 | 2/2017 | Usui | |
| 2017/0038869 | A1* | 2/2017 | Kim | ...................... G06F 3/0414 |
| 2017/0090644 | A1* | 3/2017 | Yao | ...................... G06F 3/0416 |
| 2017/0139540 | A1 | 5/2017 | Davison | |
| 2018/0081467 | A1* | 3/2018 | Jiang | ...................... H03K 17/96 |

FOREIGN PATENT DOCUMENTS

| JP | 2009239649 A | 10/2009 |
| JP | 2017017450 A | 1/2017 |

* cited by examiner

*Primary Examiner* — Stephen G Sherman
(74) *Attorney, Agent, or Firm* — The Noblill Group, PLLC; Hettie L. Haines (57) ABSTRACT

Various embodiments of the present technology may comprise methods and apparatus for a touch sensor. The capacitive touch sensor may comprise a plurality of drive electrodes and a reception electrode, wherein two capacitors are formed. Under various conditions, the capacitive touch sensor may be configured to trigger a touch event in the presence of a human finger and trigger a non-touch event in the presence of water.

18 Claims, 9 Drawing Sheets

METHODS AND APPARATUS FOR A CAPACITIVE TOUCH SENSOR

BACKGROUND OF THE TECHNOLOGY

Mutual capacitive touch sensors operate by detecting and/or measuring the capacitance of a capacitive sense element, and detecting and/or measuring a change in capacitance indicating a touch or presence of a conductive object. When the conductive object (e.g., a finger, water) comes near and/or in contact with the capacitive sense element, the capacitance changes and the conductive object is detected. An electrical circuit may be utilized to measure the change in capacitance of the capacitive touch sense element, and the electrical circuit may convert the measured capacitance of the capacitive sense element into a voltage and/or digital value to represent a touch event and, alternatively, a non-touch event (no touch).

In many conventional systems, however, the presence of water on the capacitive touch sensor may trigger a touch event. A touch event triggered by water is undesirable and referred to as a false touch event.

SUMMARY OF THE INVENTION

Various embodiments of the present technology may comprise methods and apparatus for a capacitive touch sensor. The capacitive touch sensor may comprise a plurality of drive electrodes and a reception electrode, wherein two capacitors are formed. Under various conditions, the capacitive touch sensor may be configured to trigger a touch event in the presence of a human finger and trigger a non-touch event in the presence of water.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and circuit diagrams. Such functional blocks and circuit diagrams may be realized by any number of components configured to perform the specified functions and achieve the various results. For example, the present technology may employ various types of analog-to-digital converters, capacitors, amplifiers, power sources, and the like, which may carry out a variety of functions. The methods and apparatus for a capacitive touch sensor according to various aspects of the present technology may operate in conjunction with any electronic system, such as an automotive system, a security system, an entry system, and the like.

Figure 1:
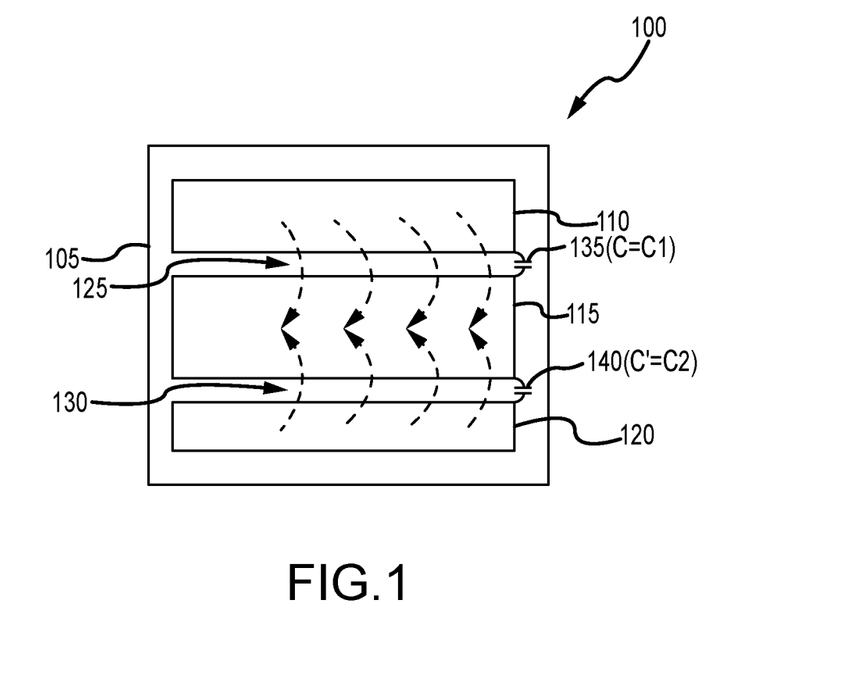
FIG. 1 representatively illustrates a capacitive touch sensor in accordance with an exemplary embodiment of the present technology.

Referring to FIG. 1, in various embodiments of the present technology, a capacitive touch sensor 100 may detect an object, such as a human fingertip, by measuring a change in a capacitance and/or a digital output of the capacitive touch sensor 100. For example, the capacitive touch sensor 100 may produce an electric field at a surface of the capacitive touch sensor 100 and respond when an object makes contact with the surface. The capacitive touch sensor 100 may also operate as a proximity sensor to detect an object within the electric field and/or approaching a surface of the capacitive touch sensor 100. As such, the object may not need to physically touch the touch sensor 100 to effect a change in the capacitance.

Referring back to FIG. 1, in various embodiments, the capacitive touch sensor 100 may be configured as a mutual capacitance sensor. For example, the capacitive touch sensor 100 may comprise a plurality of electrodes suitably configured to form a sense capacitor 135 (a first capacitor 135) and create a first electric field 125, and to form a reference capacitor 140 (a second capacitor 140) and create a second electric field 130. In an exemplary embodiment, the capacitive touch sensor 100 may comprise a first drive electrode 110, a second drive electrode 120, and a reception electrode 115. The electrodes 110, 115, 120 may be formed using a conductive material, such as metal. The electrodes 110, 115, 120 may comprise any suitable size or shape, and may be arranged in various configurations. Such parameters may be based on the particular application, desired sensitivity, desired overall size of the capacitive touch sensor 100, and the like.

In an exemplary embodiment, the reception electrode 115 and the first drive electrode 110 form the first capacitor 135, and in operation, the first electric field 125 may be formed between the reception electrode 115 and the first drive electrode 110. The reception electrode 115 and the second drive electrode 120 form the second capacitor 140, and in operation, the second electric field 130 may be formed between the reception electrode 115 and the second drive electrode 120. In various embodiments, the first and second drive electrodes 110, 120 may be selectively connected to one of a supply voltage $V_{DD}$ and a reference voltage, such as a ground voltage GND.

Figure 2:
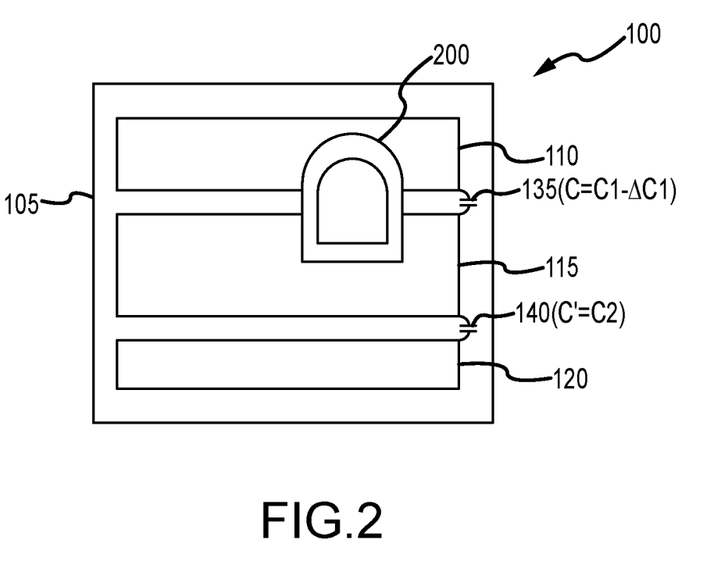
FIG. 2 representatively illustrates the capacitive touch sensor in the presence of a finger and in accordance with an exemplary embodiment of the present technology.
Figure 3:
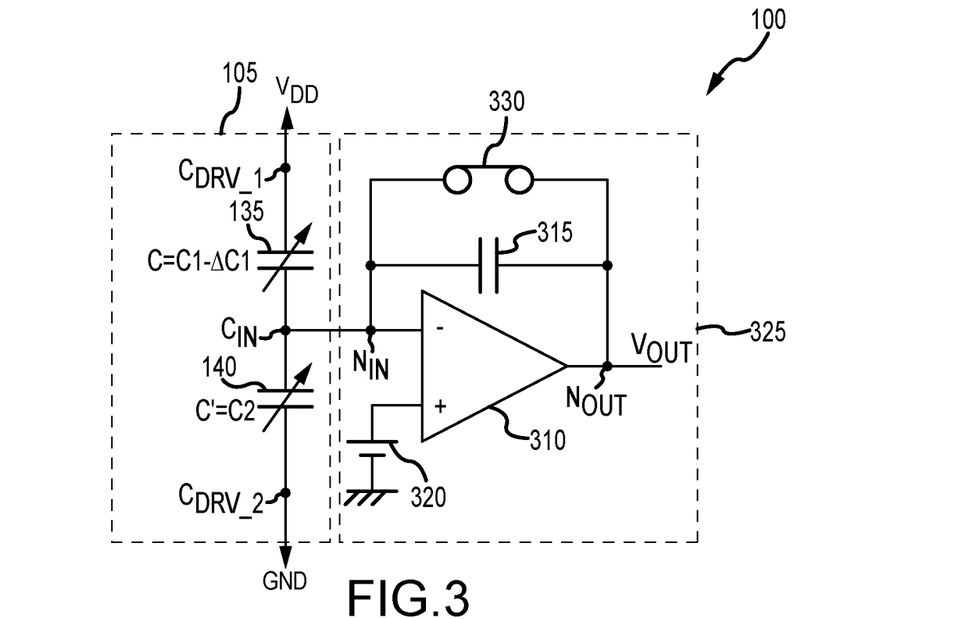
FIG. 3 is an equivalent circuit diagram of the capacitive touch sensor during a first phase of operation in the presence of a finger and in accordance with an exemplary embodiment of the present technology.
Figures 8A, 8B, 8C:
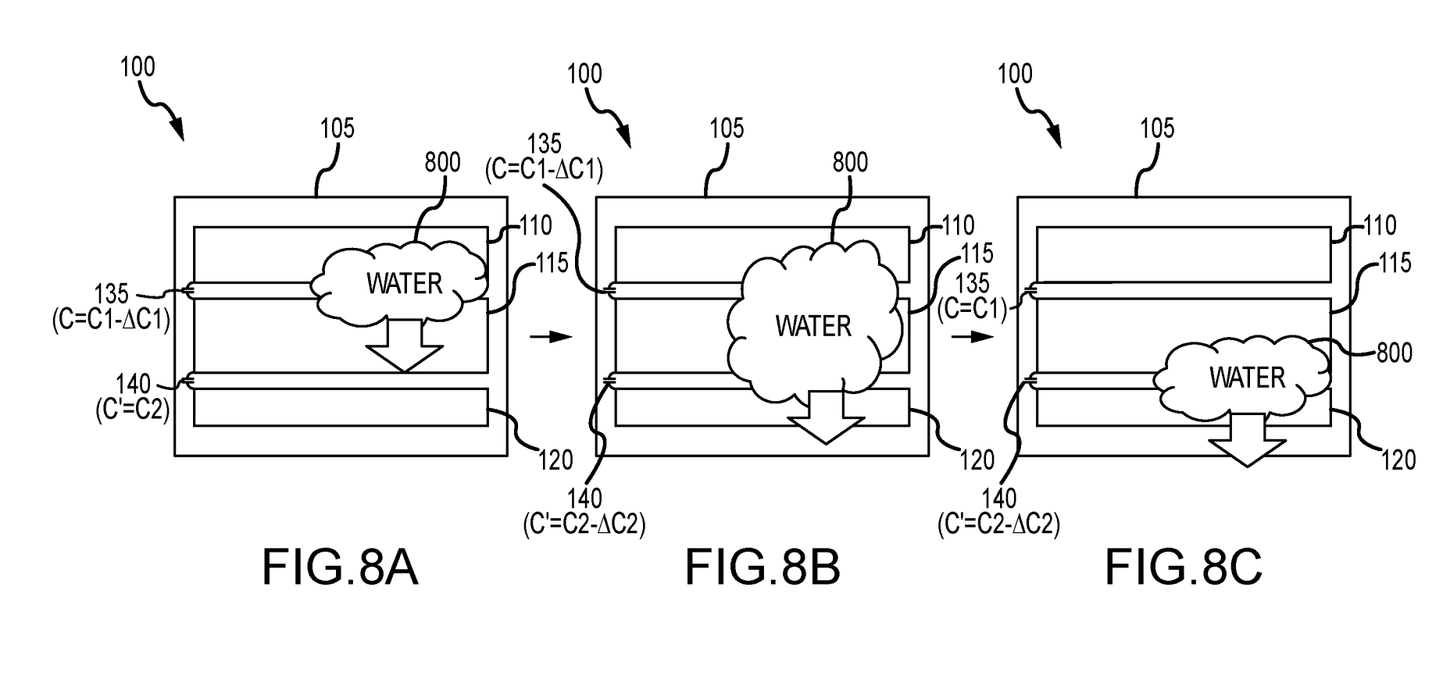
FIGS. 8A-8C representatively illustrate water flowing across the capacitive touch sensor in accordance with an exemplary embodiment of the present technology.

According to various embodiments, and referring to FIGS. 2, 3, and 8A, the capacitive touch sensor 100 is configured to respond to a specific stimulus, such as a human finger 200, and ignore other stimulus, such as water 800. The capacitive touch sensor 100 may comprise various input devices, such as buttons, switches, dials, sliders, keys or keypads, navigation pads, and touch pad, and may be integrated in an electronic device and/or system, such as a door handle on an automobile, a security system on a home, and the like. According to an exemplary embodiment, the capacitive touch sensor 100 may comprise a touch panel 105, suitable for contact by the human finger 200 and/or water 800, and a detection circuit 325 connected to the touch panel 105 and configured to detect and/or measure changes in the electric field in response to various stimuli.

The touch panel 105 may comprise a substrate (not shown) on which the electrodes 110, 115, 120 are formed. For example, the touch panel 105 may comprise any suitable material for depositing, forming, and/or inscribing a circuit, such as glass coated with indium tin oxide, a PET (polyethylene terephthalate) substrate, a polymer film, a PCB substrate, and the like. In various embodiments, the touch panel 105 may comprise one or more substrate layers.

In various embodiments, the drive electrodes 110, 120 and the reception electrode 115 may be coplanar. For example, the drive electrodes 110, 120 and the reception electrode 115 may be formed on the same substrate layer. In alternative embodiments, one electrode may be formed on one substrate layer, while another electrode may be formed on a different substrate layer. The first drive electrode 110 may be represented schematically as a first drive node $C_{DRV\_1}$, the second drive electrode 120 may be represented schematically as a second drive node $C_{DRV\_2}$, and the reception electrode may be represented schematically as an input node $C_{IN}$.

According to one embodiment, and referring to FIG. 3, in the absence of any stimuli, a capacitance C of the first capacitor 135 may defined as a first resting capacitance C1 (i.e., C=C1) and a capacitance C' of the second capacitor 140 may be defined as a second resting capacitance C2 (i.e., C'=C2). According to one embodiment, the first resting capacitance C1 is equal to the second resting capacitance C2 (i.e., C1=C2).

Figure 10:
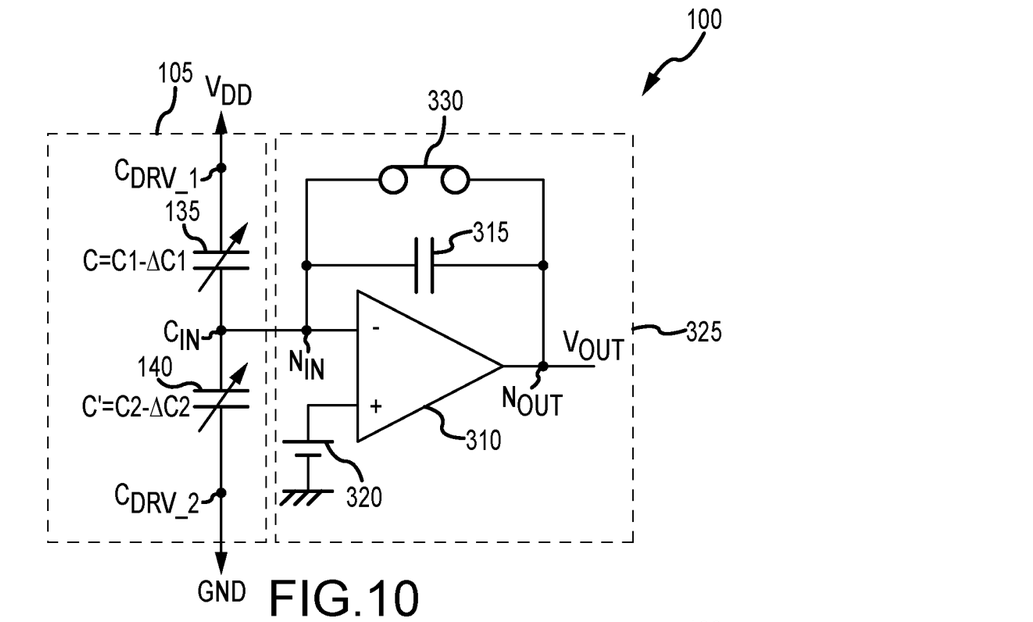
FIG. 10 is an equivalent circuit diagram of the capacitive touch sensor during a first phase of operation in the presence of water and in accordance with an exemplary embodiment of the present technology.

In the presence of stimuli, the capacitance C of the first capacitor 135 may be defined as the first resting capacitance C1 minus a change in capacitance of the first capacitor 135 (i.e., C=C1−ΔC1). Similarly, and referring to FIGS. 10 and 11, the capacitance C' of the second capacitor 140 may be defined as the second resting capacitance C2 minus a change in capacitance of the second capacitor 140 (i.e., C'=C2−ΔC2).

Figure 5:
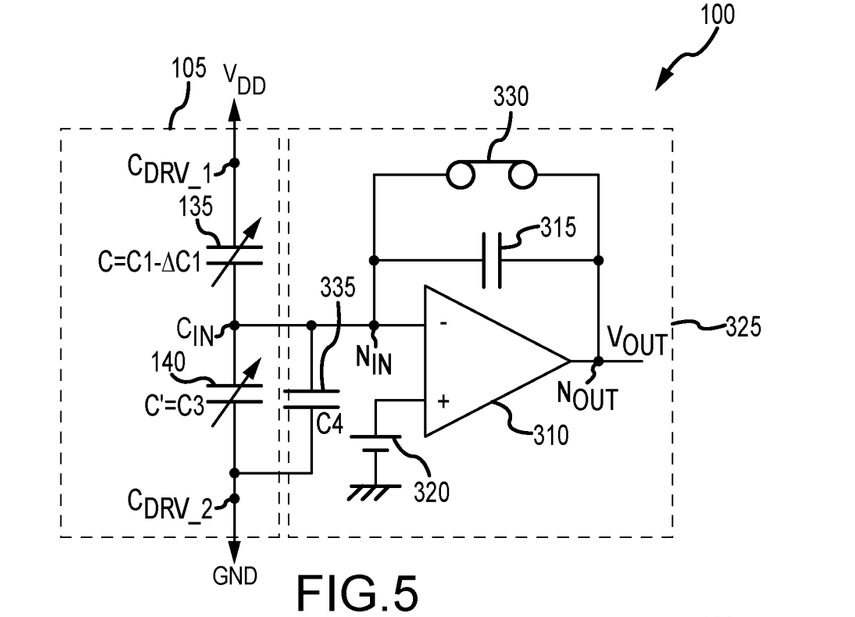
FIG. 5 is an alternative equivalent circuit diagram of the capacitive touch sensor during a first phase of operation in the presence of a finger and in accordance with an exemplary embodiment of the present technology.
Figure 6:
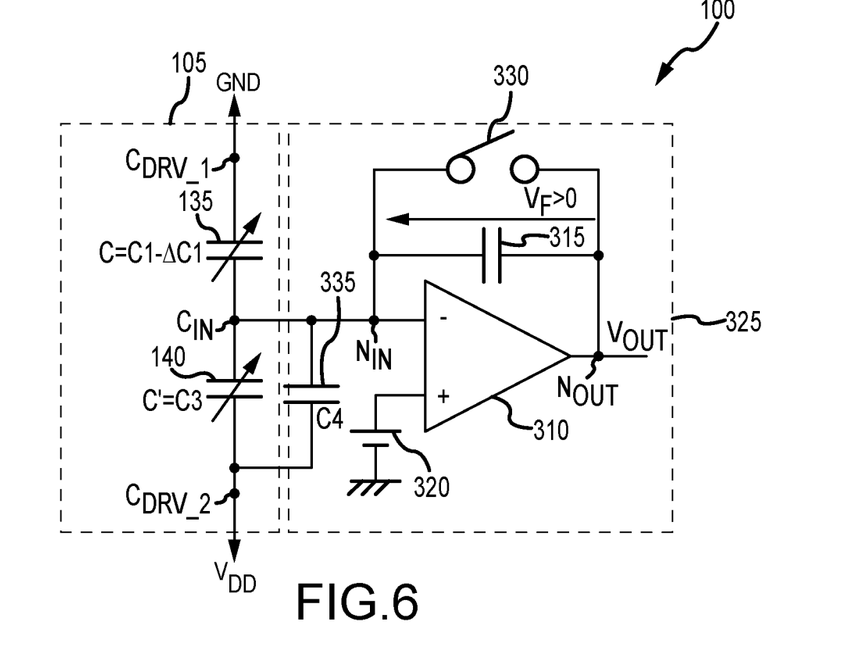
FIG. 6 is an alternative equivalent circuit diagram of the capacitive touch sensor during a second phase of operation in the presence of a finger and in accordance with an exemplary embodiment of the present technology.
Figure 7:
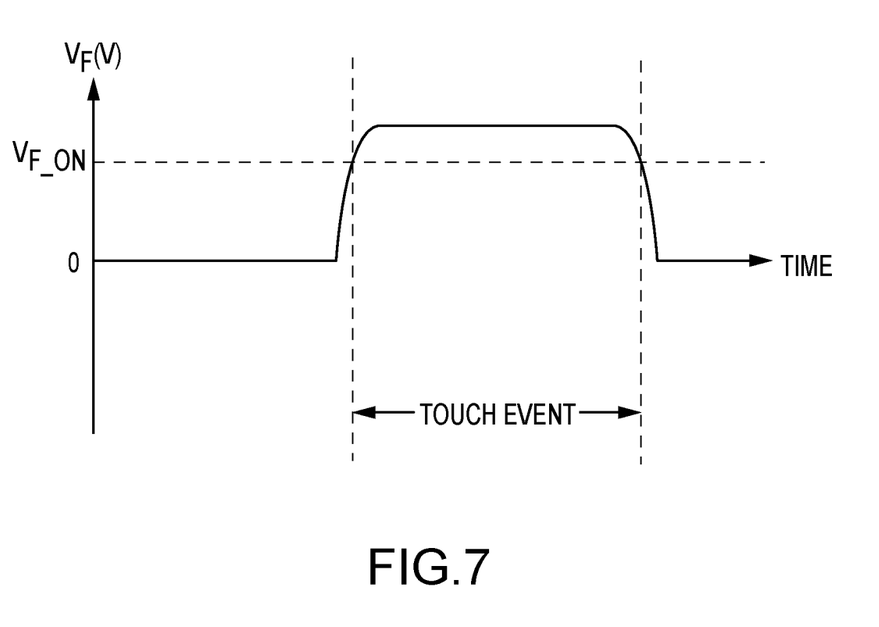
FIG. 7 graphically illustrates an output voltage of the capacitive touch sensor in the presence of a finger and in accordance with an exemplary embodiment of the present technology.

Referring to FIG. 5, in an alternative embodiment, in the absence of any stimuli, a capacitance between the second drive node $C_{DRV\_2}$ and the input node $C_{IN}$ may be defined as a third resting capacitance C3 (i.e., C'=C3). In the present case, the first resting capacitance C1 is greater than the third resting capacitance C3 (i.e., C1>C3).

In the presence of stimuli, the capacitance C of the first capacitor may be defined as the first resting capacitance C1 minus a change in capacitance of the first capacitor 135 (i.e., C=C1−ΔC1). Further, the second capacitance C' may be defined as the third resting capacitance C3 plus a fourth capacitance C4 minus a change in capacitance of the second capacitor 140 (i.e., C'=C3+C4−ΔC3) (not shown).

In various embodiments, the touch sensor 100 may detect various stimuli by measuring and/or detecting changes in capacitance of the first and second capacitors 135, 140 and generate an output voltage $V_{OUT}$ according to the changes in capacitance. In various embodiments, the detection circuit 325 may be connected to the touch panel 105 and configured to convert a change in capacitance to an output voltage $V_{OUT}$ and then convert the output voltage $V_{OUT}$ into a digital output. For example, the detection circuit 325 may comprise a differential amplifier 310 to convert a change in capacitance to a change in the output voltage $V_{OUT}$, and an analog-to-digital converter (not shown) to convert the change in the output voltage $V_{OUT}$ to the digital output. A first terminal of the differential amplifier 310, such as the inverting terminal (−), may be connected to the touch panel 105, such the input node $C_{IN}$, to detect and/or measure a change in capacitance of the first capacitor 135 (ΔC1) and/or a change in capacitance of the second capacitor 140 (ΔC2). A second terminal of the differential amplifier 310, such as the non-inverting terminal (+), may be coupled to voltage source 320 having a voltage $V_{DD}$, such as 0.5V.

The detection circuit 325 may further comprise a feedback capacitor 315 having a feedback capacitance $C_F$ and a switch 330. The feedback capacitor 315 and the switch 330 may be connected in parallel and between the inverting terminal (−), and an output terminal $N_{OUT}$ of the differential amplifier 310. The switch 330 may comprise any device and/or system suitable for opening and closing an electrical connection, such as a transistor, an analog switch, and the like.

In the absence of a stimulus, the output voltage $V_{OUT}$ may be defined as an initial output voltage $V_{OUT\_INT}$. In the presence of a stimulus the output voltage $V_{OUT}$ may be defined as the initial output voltage minus a feedback voltage $V_F$ ($V_{OUT}=V_{OUT\_INT}-V_F$), where the feedback voltage $V_F$ is a voltage across the feedback capacitor 315, and defined as the change in capacitance of first capacitor ΔC1 divided by the feedback capacitance $C_F$ and then multiplied by the supply voltage $V_{DD}$ (i.e., $V_F=(\Delta C1/C_F) \times V_{DD}$).

In general, as a human finger approaches the surface of the touch panel 105, some of the electric field is absorbed by the finger, thereby decreasing the amount of energy detected by the capacitive touch sensor 100 and reducing the capacitance. As the finger gets closer to the surface of the touch panel 105, more of the electric field is absorbed and the capacitance may continue to decrease until the finger makes contact with the surface of the touch panel 105. The change in capacitance causes a change in the output voltage $\Delta V_{OUT}$ from an initial value, for example a value equal to the supply voltage $V_{DD}$.

According to various operations, and referring to FIGS. 2, 3, 8A, and 10, the output voltage may decreases from an initial value in the presence of the human finger 200 or water 800. The amount of change in the output voltage $\Delta V_{OUT}$ (from the initial output voltage $V_{OUT\_INT}$) may be interpreted as a touch event or a non-touch event. For example, if the change in the output voltage $\Delta V_{OUT}$ is greater than zero (i.e., $\Delta V_{OUT}>0$), this may be interpreted as a touch event. A system that incorporates the capacitive touch sensor 100 may respond to a touch event in a particular manner. For example, in an automotive system, a touch event may correspond to locking or unlocking a door lock on the automobile. Alternatively, if the change in output voltage $\Delta V_{OUT}$ is equal to zero (i.e., $\Delta V_{OUT}=0$), this may be interpreted as a non-touch event. In such as a case, the system would not respond.

In an exemplary operation, and referring to FIGS. 2-4 and 10-11, the capacitive touch sensor 100 operates in a first phase and a second phase. For example, during the first phase, and referring to FIGS. 3 and 10, the switch 330 is closed, the first drive node $C_{DRV\_1}$ is selectively connected to the supply voltage $V_{DD}$, and the second drive node $C_{DRV\_2}$ is selectively connected to the ground voltage GND.

Figure 4:
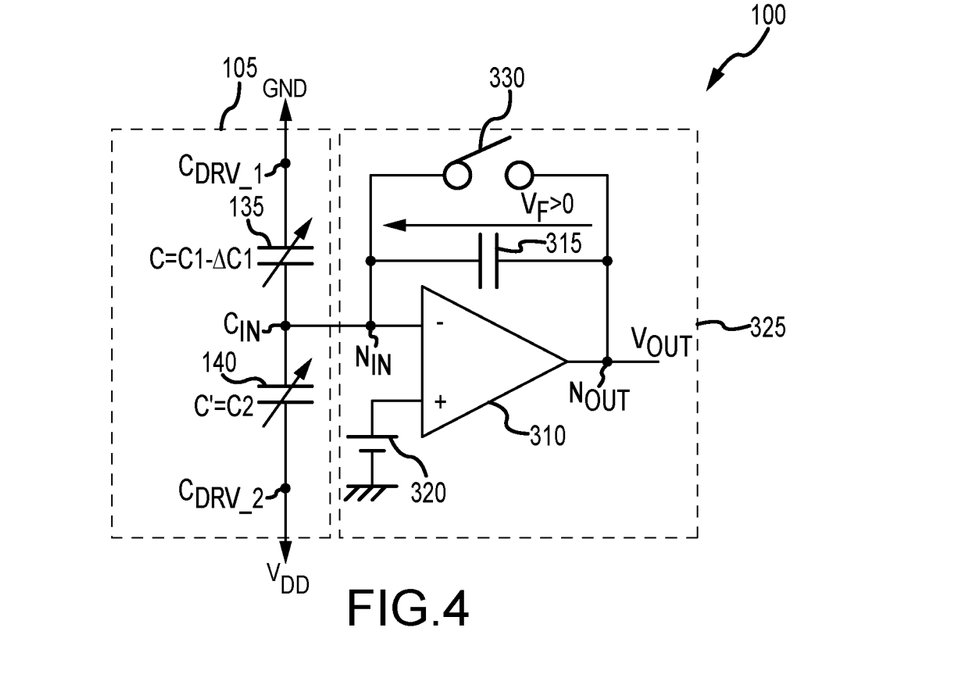
FIG. 4 is an equivalent circuit diagram of the capacitive touch sensor during a second phase of operation in the presence of a finger and in accordance with an exemplary embodiment of the present technology.
Figure 11:
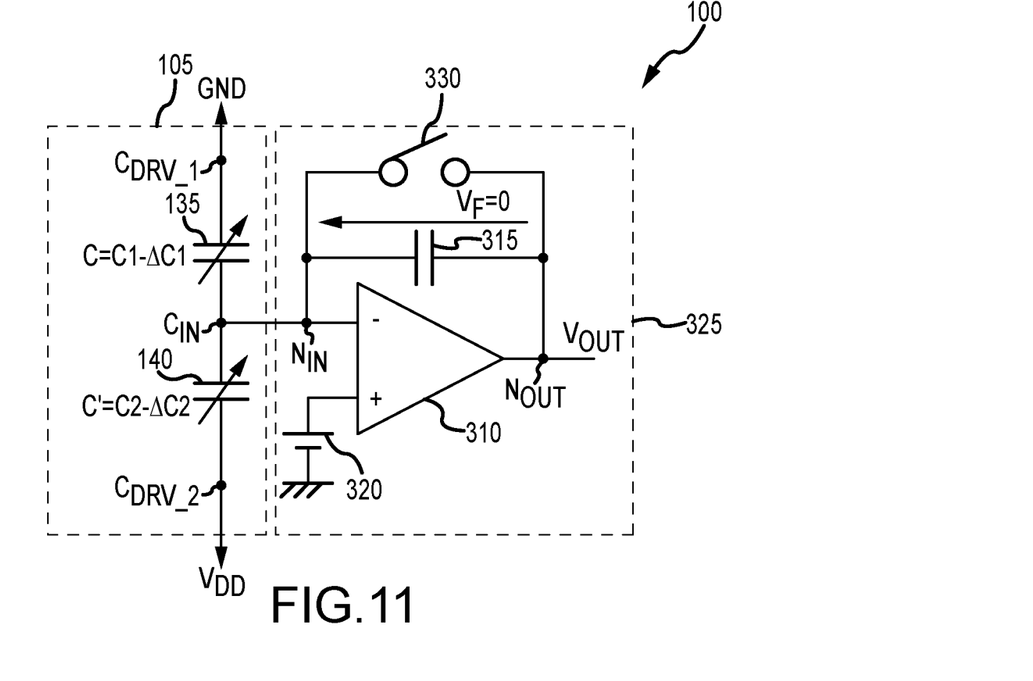
FIG. 11 is an equivalent circuit diagram of the capacitive touch sensor during a second phase of operation in the presence of water and in accordance with an exemplary embodiment of the present technology.

During the second phase, and referring to FIGS. 4 and 11, the switch is open, the first drive node $C_{DRV\_1}$ is selectively connected to the ground voltage GND, and the second drive node $C_{DRV\_2}$ is selectively connected to the supply voltage $V_{DD}$, which further increases the feedback voltage $V_F$.

Referring to FIGS. 2, 3, 4, and 7, when the finger 200 approaches and touches the surface of the touch panel 105 between the first drive electrode 110 and the reception electrode 115, the capacitance C of the first capacitor 135 decreases, such that the capacitance C is equal to the resting capacitance C1 minus the change in capacitance $\Delta C1$ (i.e., $C=C1-\Delta C1$) and the feedback voltage $V_F$ increases to a value greater than a predetermined threshold $V_{F\_ON}$. Since the finger 200 does not disturb the second electric field 130, the capacitance C' of the second capacitor 140 remains unchanged from the first phase (FIG. 3) to the second phase (FIG. 4). These conditions result in a change in output voltage $\Delta V_{OUT}$ greater than zero, and the capacitive touch sensor 100 triggers a touch event.

Referring to FIGS. 8A-8C and 9-11, when water 800 flows on the surface of the touch panel 105, the water 800 disturbs the first and second electric fields 125, 130 resulting in a change in capacitance of the first and second capacitors 135, 140. At a start of water flow (FIG. 8A), the capacitance C of the first capacitor is equal to the resting capacitance C1 minus the change in capacitance $\Delta C1$ (i.e., $C=C1-\Delta C1$) and the capacitance C' of the second capacitor is equal to the second resting capacitance C2, thereby increasing the feedback voltage $V_F$ to a value that does not reach or exceed the predetermined threshold $V_{F\_ON}$. During water flow (FIG. 8B), the capacitance C of the first capacitor is equal to the resting capacitance C1 minus the change in capacitance $\Delta C1$ (i.e., $C=C1-\Delta C1$), the capacitance C' of the second capacitor is equal to the second resting capacitance C2 minus the change in the capacitance $\Delta C2$ (i.e., $C'=C2-\Delta C2$), thereby effectively cancelling any effect on the feedback voltage $V_F$. During the end of water flow (FIG. 8C), the capacitance C of the first capacitor is equal to the resting capacitance C1 (i.e., $C=C1$), the capacitance C' of the second capacitor is equal to the second resting capacitance C2 minus the change in the capacitance $\Delta C2$ (i.e., $C'=C2-\Delta C2$), thereby decreasing the feedback voltage $V_F$. These conditions result in a change in output voltage $\Delta V_{OUT}$ equal to zero, and the capacitive touch sensor 100 triggers a non-touch event.

Figure 9:
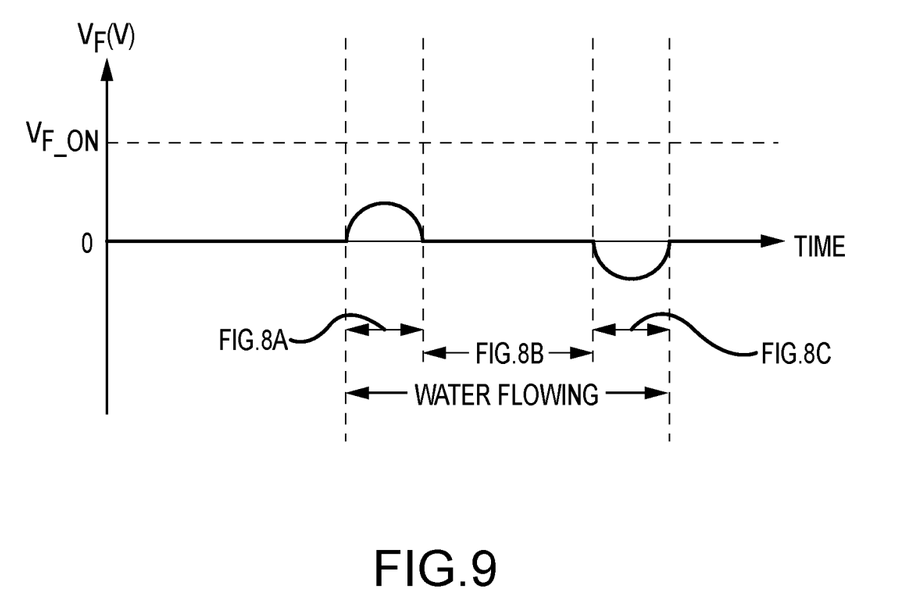
FIG. 9 graphically illustrates an output voltage of the capacitive touch sensor in the presence of water and in accordance with an exemplary embodiment of the present technology.
Figure 12:
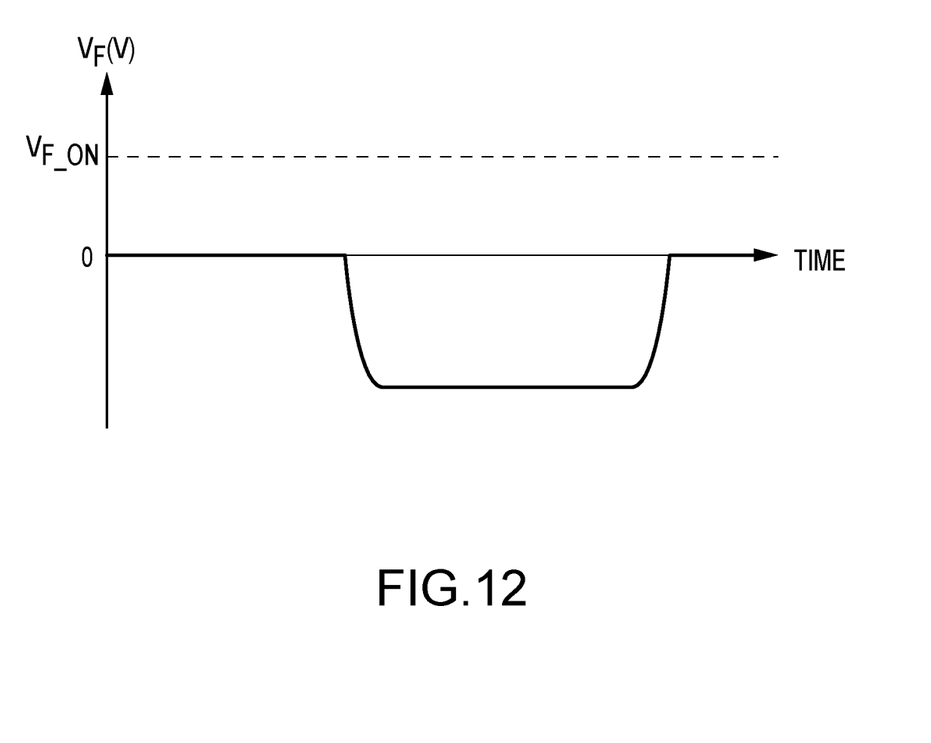
FIG. 12 graphically illustrates an output voltage of the capacitive touch sensor in the presence of a finger and in accordance with an exemplary embodiment of the present technology.

In cases where the finger 200 disrupts both electric fields 125, 130, or disrupts only the second electric field 130, the capacitive touch sensor triggers a non-touch event. For example, in a case where the finger 200 disrupts both electric fields 125, 130, the capacitive touch sensor 100 will respond in the same manner as during water flow, such as illustrated in FIG. 9 with respect to FIG. 8B. Further, and referring to FIGS. 1 and 12, in a case where the finger 200 disrupts only the second electric field 130, the feedback voltage $V_F$ decreases. This condition results in a change in output voltage $\Delta V_{OUT}$ less than zero, and the capacitive touch sensor triggers a non-touch event.

The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

The invention claimed is:

1. A capacitive touch sensor, comprising:
   a touch panel comprising:
      an input electrode;
      a first drive electrode; and
      a second drive electrode;
      wherein:
         the input electrode and the first drive electrode form a first capacitor; and
         the input electrode and the second drive electrode form a second capacitor; and
   a detection circuit coupled to the touch panel and configured to generate:
      a feedback voltage, wherein the feedback voltage is greater than zero when there is a change in capacitance of the first capacitor and a capacitance of the second capacitor remains constant; and
      an output voltage according to the feedback voltage.

2. The capacitive touch sensor according to claim 1, wherein the detection circuit comprises:
   an operational amplifier comprising a first input terminal and an output terminal, and coupled to the touch panel via the first input terminal; and
   a feedback capacitor coupled between the first input terminal and the output terminal.

3. The capacitive touch sensor according to claim 1, wherein an initial capacitance of the first capacitor is equal to an initial capacitance of the second capacitor.

4. The capacitive touch sensor according to claim 1, wherein the detection circuit is further configured to measure a change in capacitance of the first capacitor and a change in capacitance of the second capacitor.

5. The capacitive touch sensor according to claim 1, wherein:
   the second drive electrode and the detection circuit form a third capacitor; and
   an initial capacitance of the first capacitor is different from an initial capacitance of the second capacitor.

6. The capacitive touch sensor according to claim 5, wherein the detection circuit sums a change in capacitance of the second capacitor with an initial capacitance of the third capacitor.

7. The capacitive touch sensor according to claim 1, wherein the feedback voltage is equal to zero when there is a change in capacitance of the first capacitor and a change in capacitance of the second capacitor.

8. The capacitive touch sensor according to claim 1, where a non-touch event is generated when one of:
   the feedback voltage is equal to zero; and
   the feedback voltage is greater than zero and less than a threshold voltage.

9. The capacitive touch sensor according to claim 1, wherein a touch event is generated when the feedback voltage is greater than a threshold voltage.

10. A method for operating a capacitive touch sensor, comprising:
    detecting a first capacitance of a first capacitor during a first phase, wherein the first capacitor is formed in a touch panel between an input electrode and a first drive electrode;
    detecting a second capacitance of a second capacitor during a second phase, wherein the second capacitor is formed in the touch panel between the input electrode and a second drive electrode; wherein the input electrode, the first drive electrode, and the second drive electrode are arranged in parallel with each other;
    generating, with a detection circuit coupled to the touch panel, a feedback voltage according to the detected first and second capacitances; and
    generating, with the detection circuit, an output voltage according to the feedback voltage, wherein the output voltage corresponds to one of: a touch event and a non-touch event;
    wherein:
       during the first phase, the first drive electrode is connected to a supply voltage and the second drive electrode is connected to a ground voltage; and
       during the second phase, the first drive electrode is connected to the ground voltage and the second drive electrode is connected to the supply voltage.

11. The method for operating a capacitive touch sensor according to claim 10, wherein the feedback voltage is equal to zero when there is a change in capacitance of the first capacitor and a change in capacitance of the second capacitor.

12. The method for operating a capacitive touch sensor according to claim 10, wherein the feedback voltage is greater than zero when there is a change in capacitance of the first capacitor and a capacitance of the second capacitor remains constant.

13. The method for operating a capacitive touch sensor according to claim 10, wherein:
    the touch event corresponds to a feedback voltage greater than a threshold voltage; and
    the non-touch event corresponds to one of:
       a feedback voltage equal to zero; and
       a feedback voltage greater than zero and less than the threshold voltage.

14. The method for operating a capacitive touch sensor according to claim 10, wherein:
    the non-touch event occurs when a change in capacitance of the second capacitor cancels a change in capacitance of the first capacitor.

15. A capacitive touch sensor, comprising:
    a touch panel comprising:
       an input electrode;
       a first drive electrode positioned in parallel with and adjacent to a first side of the input electrode; and
       a second drive electrode positioned in parallel with and adjacent to a second side, directly opposite the first side, of the input electrode;
       wherein:
          the input electrode and the first drive electrode form a first capacitor;
          the input electrode and the second drive electrode form a second capacitor; and
          the first and second electrodes are selectively connected to a supply voltage and a ground voltage; and
    a detection circuit coupled to the touch panel and configured to generate:
       a feedback voltage according to the first and second capacitors; and
       an output voltage according to the feedback voltage;
       wherein the output voltage corresponds to one of: a touch event and a non-touch event.

16. The capacitive touch sensor according to claim 15, wherein:
    the touch event corresponds to a feedback voltage greater than a threshold voltage; and
    the non-touch event corresponds to one of:
       a feedback voltage equal to zero; and
       a feedback voltage greater than zero and less than the threshold voltage.

17. The capacitive touch sensor according to claim 15, wherein the feedback voltage is equal to zero when there is a change in capacitance of the first capacitor and a change in capacitance of the second capacitor.

18. The capacitive touch sensor according to claim 15, the feedback voltage is greater than zero when there is a change in capacitance of the first capacitor and a capacitance of the second capacitor remains constant.

* * * * *